United States Patent
Chauhan et al.

(10) Patent No.: US 7,382,711 B2
(45) Date of Patent: *Jun. 3, 2008

(54) METHOD AND APPARATUS FOR CONSTANT LINEAR VELOCITY ELECTRON BEAM SUBSTRATE PROCESSING

(75) Inventors: Sundeep Chauhan, Edina, MN (US);
Lawrence Bryant, Palo Alto, CA (US);
Neil Deeman, Alamo, CA (US);
Christopher Formato, Brentwood, CA (US); David Kuo, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 749 days.

This patent is subject to a terminal disclaimer.

(21) Appl. No.: 10/783,263

(22) Filed: Feb. 19, 2004

(65) Prior Publication Data

US 2005/0185562 A1 Aug. 25, 2005

(51) Int. Cl.
*G11B 9/10* (2006.01)
(52) U.S. Cl. ........................ 369/126; 369/101
(58) Field of Classification Search .............. 369/126, 369/101
See application file for complete search history.

(56) References Cited

U.S. PATENT DOCUMENTS

| 4,067,044 A * | 1/1978 | Maeda et al. ............. 369/44.13 |
| 6,204,989 B1 * | 3/2001 | Hrinya et al. ............ 360/77.06 |
| 2003/0021206 A1 * | 1/2003 | Tomita ..................... 369/53.23 |

* cited by examiner

*Primary Examiner*—Wayne Young
*Assistant Examiner*—LaTanya Bibbins (57) ABSTRACT

Embodiments of the invention generally provide an electron beam substrate processing system. In one embodiment, the present invention provides an electron beam substrate processing system where a spindle shaft used to rotate substrates during processing includes at least one optical encoder wheel assembly. The optical encoder wheel assembly is configured to provide rotational speed data signal to a rotational speed control system and a pattern generation clock circuit configured to a provide an angular pattern generator clock signal and to a pattern generator circuit. The pattern generation circuit is configured to control modulation of an electron beam used for substrate processing. In one aspect of the present invention, while the spindle shaft is rotated at a constant linear velocity, the pattern generation circuit controls the modulation of an electron beam such that written mark lengths are sized to be about constant in angular dimension.

20 Claims, 5 Drawing Sheets

METHOD AND APPARATUS FOR CONSTANT LINEAR VELOCITY ELECTRON BEAM SUBSTRATE PROCESSING

BACKGROUND OF THE INVENTION

1. Field of the Invention

The invention relates generally to processing substrates with electron beams. More particularly, the present invention relates to applying electron beams to surfaces of substrates to write data patterns thereon.

2. Description of the Related Art

In electron beam substrate processing systems, a narrowly converged electron beam is applied to target positions on the surface of substrates to form patterns thereon. Electron beam substrate processing systems generally include an electron gun, electromagnetic lens, and a vacuum chamber for holding the specimen substrate. Electron beam substrate processing systems write a desired pattern on a substrate surface usually coated with electron beam resist by focusing, directing, and blanking the electron beam such that only specified surface areas of the substrate are processed.

Processing substrates generally involves raster-scan and vector-scan processes. According to the raster-scan process, a rectangular region of the substrate, also referred to as a field, is sequentially and fully scanned at the same speed, one end to the other, before moving to the next field. The electron beam is applied to the region of the field where a pattern is to be written and blocked, from other regions by a blanking mechanism. According to the vector-scanning process, an electron beam skips areas where no graphic pattern is to be written, and is deflected only to a substrate surface area where a pattern is to be written.

Substrates are often processed with electron beam processing systems where the substrate is placed on a movable electronic chuck within a vacuum-processing chamber. Such electron beam assemblies usually include a load lock chamber and transfer robot to hold and transfer the substrates onto the electronic chuck for processing. To position the substrate within a preferred radius of the electron beam the electronic chuck and substrate thereon are moved in a horizontal X and Y direction. Once in a desired position the electron beam may be deflected to more accurately position the electron beam onto the substrate.

Substrates may be processed using rotating electron beam substrate processing systems. Rotating electron beam substrate processing systems rotate substrates underneath a narrowly focused electron beam that may also use deflection to accurately position the electron beam on the substrate surface. Similar to the non-rotating electron beam systems, blanking control is generally used to correctly apply the electron beam to a surface region of the rotating substrate surface.

In rotating electron beam substrate processing systems, the substrate is mounted on a rotating spindle assembly. The rotating spindle assembly is coupled to a spindle motor that provides rotational speed to the spindle and therefore the specimen substrate. The rotational velocity and acceleration of the spindle is generally controlled by a controller in communication with the spindle motor. The spindle assembly is generally configured to move in a radial direction relative to an electron beam discharge assembly, i.e., electron gun, to allow the electron beam to be precisely positioned on desired surfaces of the rotating substrate. As the substrate is rotated and moved, the electron beam is deflected as needed and applied to the desired regions of the substrate using a blanking control. To correctly apply the proper pattern to the substrate being processed, a pattern clock may be used. Conventionally, the pattern clock is associated with the spindle rotational speed and position of the spindle relative the electron beam such that at calculated times based on the angular rotation and movement of the substrate, a pattern region will be positioned within a radius of the electron beam for processing.

Generally, an optical encoder is used in the control of rotation of the spindle. The optical encoder generally includes an optical reader positioned to read an optical encoder disk. Conventionally, to mechanically couple the optical encoder disk to the substrate, the optical encoder disk is mounted on an end of the spindle shaft distal the substrate. As the spindle motor rotates, the optical reader detects timing marks on the optical disk to determine the speed of rotation. To maximize resolution, the timing marks are usually placed on the outer edge of the encoder disk and/or a larger encoder disk may be used. The detected timing marks generally provide a rotational velocity signal used as a rotation control signal. A master clock is used to generate a pattern clock signal for a pattern generation circuit. The rotation of the spindle motor is phase locked to the master clock such that the rotation of the spindle motor is adjusted until the master clock and rotation control signal are in phase. The pattern clock signal is used by the pattern generation circuit to control a blanking mechanism of the rotating electron beam substrate processing system to control the on and off time of the electron beam.

Conventionally, electron beam substrate processing systems are configured to write patterns on media, i.e. substrates, associated with constant linear velocity (CLV) systems or are configured to write patterns on media associated with constant angular velocity systems (CAV). Conventional electron beam substrate processing systems may be optimized to provide precise patterns on substrates spun at a constant linear velocity that are fixed in dimension for media used with CLV systems such as compact discs (CD), digital video discs (DVD), etc. Alternatively, conventional substrate processing systems may be configured to form patterns on a substrate spun at a constant angular velocity that vary in angular dimension for use with substrates associated with CAV systems such disk drives. Unfortunately, reconfiguring electron beam substrate processing systems to process substrates used for both CAV and CLV systems is generally complicated, prone to configuration errors, and is time consuming which reduces substrate processing throughput. Conventionally, to solve this issue, manufactures often use separate electron beam substrate processing systems optimized for processing substrates for either CLV or CAV systems, which generally increases the cost of electron beam substrate processing.

Therefore, a need exists for a method and apparatus that may be configured to write pattern data for both CLV and CAV systems that reduces substrate processing cost and increases substrate production efficiency.

SUMMARY OF THE INVENTION

An aspect of the present invention generally provides an electron beam substrate processing apparatus. The apparatus includes a substrate processing chamber defined by sidewalls, a bottom, and a top, a spindle motor assembly moveably disposed within the substrate processing chamber, and a spindle shaft extending from the spindle motor assembly toward the top. A substrate support member is mounted to an end of the spindle shaft distal the spindle motor assembly. An encoder wheel coupled to the spindle shaft is positioned adjacent the substrate support member. An optical detector is positioned in optical communication with the encoder wheel. The optical detector being configured to generate rotation data signals in response to detected rotation of the encoder wheel. The apparatus includes a pattern generator circuit configured to generate electron beam control signal in response to the rotation data signals. The electron beam control signal frequency varies as a function of at least one processing radius and angular velocity associated thereto. The electron beam assembly is responsive to the electron beam control signal. The electron beam assembly being disposed on the substrate processing chamber and configured to direct the electron beam onto a surface of the substrate for processing.

An aspect of the present invention generally provides a method of processing substrates with an electron beam processing system. The method includes rotating a substrate support member configured to hold the substrate thereon for processing, generating rotation data signals from one encoder assembly associated with a rotational movement of the substrate support member, and generating pattern clock signals from the rotation data signals that vary in frequency as a function of at least one processing radius and angular velocity associated thereto. The method includes generating an electron beam processing pattern for writing a pattern on a surface of the substrate from at least some of the pattern clock signals, wherein the processing pattern varies in angular dimension as a function of the at least one processing radius.

An aspect of the present invention generally provides an apparatus for processing a substrate with electron beams. The apparatus includes rotation means for rotating a substrate support member for processing the substrate thereon, a signal generator means for generating a rotation clock signal from the axial rotation of the substrate. The apparatus includes means for generating a pattern clock signal from the axial rotation of the substrate that varies in frequency as a function of radial processing position and angular velocity of the substrate associated thereto, and an electron beam generation means for processing the substrate with electron beams associated with the pattern clock signal.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

As will be described below, aspects of one embodiment pertain to specific method steps implementable on computer systems. In one embodiment, the invention may be implemented as a computer program-product for use with a computer system. The programs defining the functions of at least one embodiment can be provided to a computer via a variety of computer-readable media (i.e., signal-bearing medium), which include but are not limited to, (i) information permanently stored on non-writable storage media (e.g. read-only memory devices within a computer such as read only CD-ROM disks readable by a CD-ROM or DVD drive; (ii) alterable information stored on a writable storage media (e.g. floppy disks within diskette drive or hard-disk drive); or (iii) information conveyed to a computer by communications medium, such as through a computer or telephone network, including wireless communication. The latter specifically includes information conveyed via the Internet. Such signal-bearing media, when carrying computer-readable instructions that direct the functions of the invention, represent alternative embodiments of the invention. It may also be noted that portions of the product program may be developed and implemented independently, but when combined together are embodiments of the invention.

Figure 1:
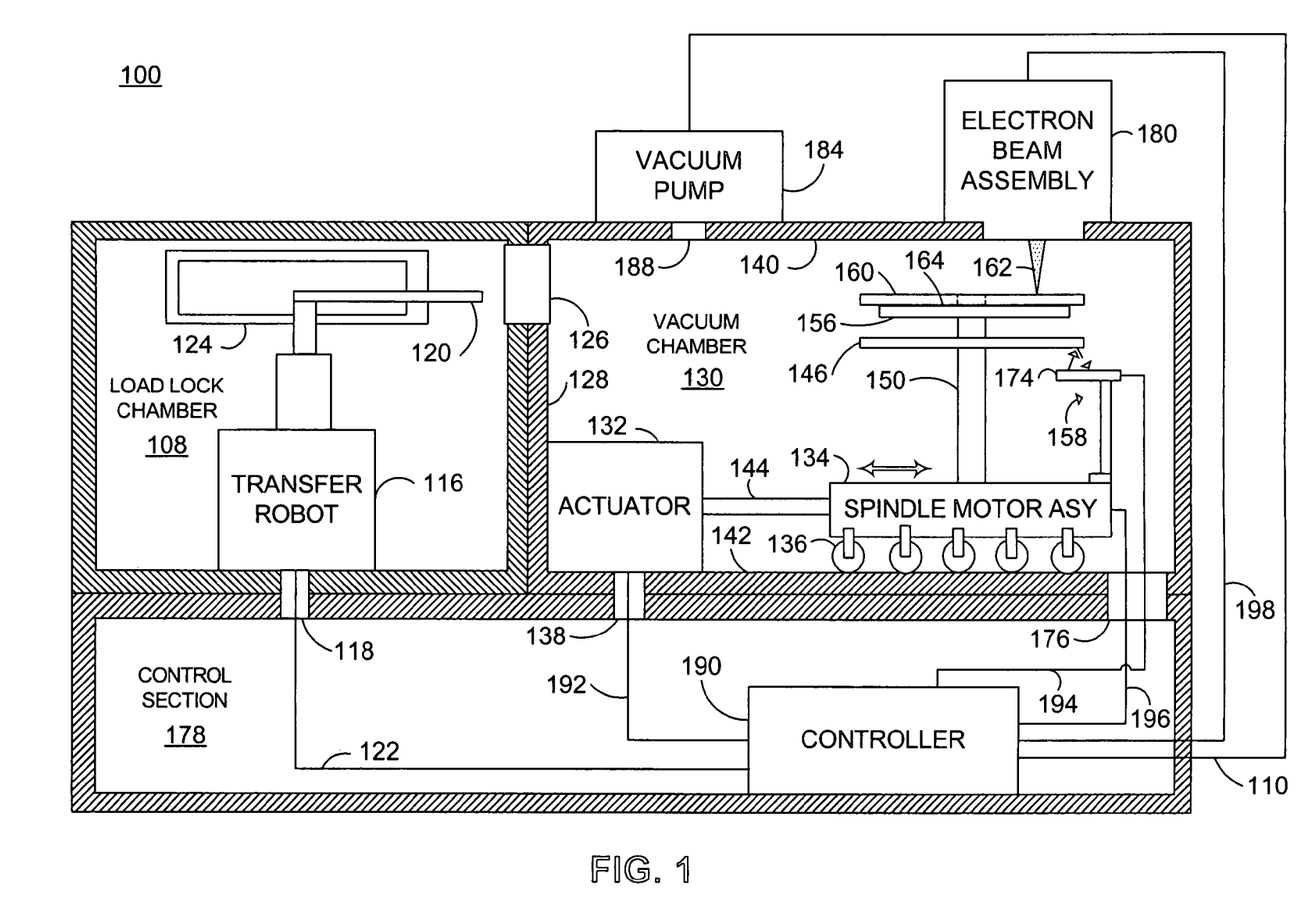
FIG. 1 is a high-level illustration of one embodiment of an electron beam substrate processing system in accordance with aspects of the invention.

FIG. 1 is a high-level illustration of one embodiment of an electron beam substrate processing system 100 in accordance with aspects of the invention. Electron beam substrate processing system 100 includes load lock chamber 108 and vacuum chamber 130. Vacuum chamber 130 is defined by sidewalls 128, top 140, and bottom 142. Load lock chamber 108 is in communication with vacuum chamber 130 via valve 126 disposed therebetween. Valve 126 may be configured to provide a vacuum seal between load lock chamber 108 and vacuum chamber 130. Valve 126 may be virtually any valve type, such as a slot valve, configured to allow substrates 160 to pass therethough. Electron beam substrate processing system 100 includes electron beam assembly 180 disposed on vacuum chamber 130 and positioned thereon in processing communication with substrate 160 disposed therein for processing with one or more electron beams 162. In one aspect, load lock chamber 108 and vacuum chamber 130 are disposed on control section 178 configured to supply control signals, power, etc., to electron beam substrate processing system 100. Vacuum chamber 130, load lock chamber 108, and control section 178 may be formed of rigid metal materials such as aluminum, steel, and the like, configured to accommodate a plurality of substrate processes. To maintain a desired vacuum, vacuum chamber 130 is coupled to vacuum pump 184 through valve 188. Control section 178 includes substrate process controller 190 used to control at least some of the substrate processing operations described herein. Vacuum pump 184 may be controlled by substrate process controller 190 via signal 110.

For purposes of clarity, electron beam substrate processing system 100 is described in terms of utilizing a vacuum environment in which to process a substrate. However, it is contemplated that electron beam substrate processing system 100 may use a non-vacuum system whereby substrate 160 is processed in an atmospheric environment. For example, electron beam assembly 180 may be placed in proximity to substrate 160 rotating at atmospheric pressure such that the gap formed therebetween is sized to allow electrons to travel therethrough.

Load lock chamber 108 includes transfer robot 116 configured to move substrates 160 to and from vacuum chamber 130 through valve 126 for processing using transfer arm 120. Transfer robot may be controlled by substrate process controller 190 via signal 122. To maintain a vacuum seal between load lock chamber 108 and control section 178, signal 122 may be coupled to transfer robot 116 through seal 118. In one aspect, load lock chamber 108 receives substrates 160 for processing through valve 124.

Electron beam substrate processing system 100 includes spindle motor assembly 134 movably disposed within vacuum chamber 130. In one aspect of the present invention, spindle motor assembly 134 is disposed on transport assembly 136. Transport assembly 136 may include virtually any type of transport mechanism, such as wheels, rollers, bearings, gears, and the like, configured to allow the about horizontal motion of spindle motor assembly 134 along bottom 142 of vacuum chamber 130. Spindle motor assembly 134 is coupled to actuator 132 via arm 144. Actuator 132 may be one of a variety actuator types such as linear actuators, rotary actuators, and the like. In one aspect, actuator 132 is a linear actuator configured to move spindle motor assembly 134 with arm 144 in about a linear straight-line motion. In another aspect, actuator 132 is a rotary actuator configured to move spindle motor assembly 134 using arm 144 in about a horizontal angular motion about a rotational center of actuator 132. While spindle motor assembly 134 may be disposed on transport assembly 136 for support thereof, it is contemplated that in one configuration spindle motor assembly 134 does not use transport assembly 136 and therefore may be entirely supported by arm 144 above bottom 142.

Spindle motor assembly 134 includes spindle shaft 150 extending vertically therefrom toward a top 140 of vacuum chamber 130. Spindle shaft 150 is rotatably coupled on one end to spindle motor assembly 134 configured to axially rotate spindle shaft 150 at one or more rotational velocities. A substrate support member 156 is coupled on another end of spindle shaft 150 distal spindle motor assembly 134. Substrate support member 156 may be virtually any type of substrate support such as an electronic chuck, mechanical clamp, and the like, configured to hold substrate 160 thereon for processing. Substrate support member 156 may be configured with support surface 164 configured to support substrate 160 thereon. Substrate support member 156 may be sized with virtually any diameter that may be used to advantage. For example, substrate support member 156 may be sized to about a similar diameter of substrate 160. Substrate support member 156 may be positioned in proximity to top 140 such that a surface portion of the substrate 160 may be aligned in proximity of electron beam 162 to form patterns thereon.

To determine rotational movements of the rotatable spindle shaft 150 and associated substrate rotational speed, encoder wheel 146 is positioned on the spindle shaft 150 about parallel to and in proximity of substrate support member 156 to rotate therewith. Encoder wheel 146 may be mounted to spindle shaft 150 using one or more methods as are known in the art. While, encoder wheel 146 may be configured in diameter about that of substrate 160, it is contemplated that the diameter of encoder wheel 146 may be of virtually any diameter that may be used to advantage.

An optical detector assembly 158 is disposed on and extends from spindle motor assembly 134. Optical detector 174 extends from optical detector assembly 158 in proximity to encoder wheel 146 to detect rotation markings thereon, some of which are described below with reference to FIG. 2. As encoder wheel 146 rotates with spindle shaft 150, such rotation markings are detected, translated to rotation signals by optical detector 174, and transmitted to substrate process controller 190 via rotation data signal 194. While, encoder wheel 146 may be sized to about a diameter of substrate 160, it is contemplated that encoder wheel 146 may be configured to virtually any diameter used to advantage.

In one operational configuration, substrate process controller 190 may be used to control a rotational speed of rotatable spindle shaft 150 and a position of spindle motor assembly 134 within vacuum chamber 130 to place one or more surface targets of substrate 160 within a desired proximity of electron beam 162 for processing. Such targets may include a portion of the substrate surface with electron beam resist disposed thereon. Rotation data signal 194 may be processed by substrate process controller 190 to determine the time and position pattern to apply electron beam 162 to the substrate surface during processing. For example, substrate process controller 190 in response to rotation data signal 194, provides signal 196 to spindle motor assembly 134 to control the rotation of spindle shaft 150. Substrate process controller 190, in response to rotation data signal 194, provides control signal 198 configured to control the modulation of electron beam 162. For example, control signal 198 may be used to turn electron beam 162 on and off at desired times during substrate processing to form a desired pattern on a surface of substrate 160. To maintain a vacuum within vacuum chamber 130, signal 196 and rotation data signal 194 may be coupled to vacuum chamber 130 through seal 176.

Figure 2:
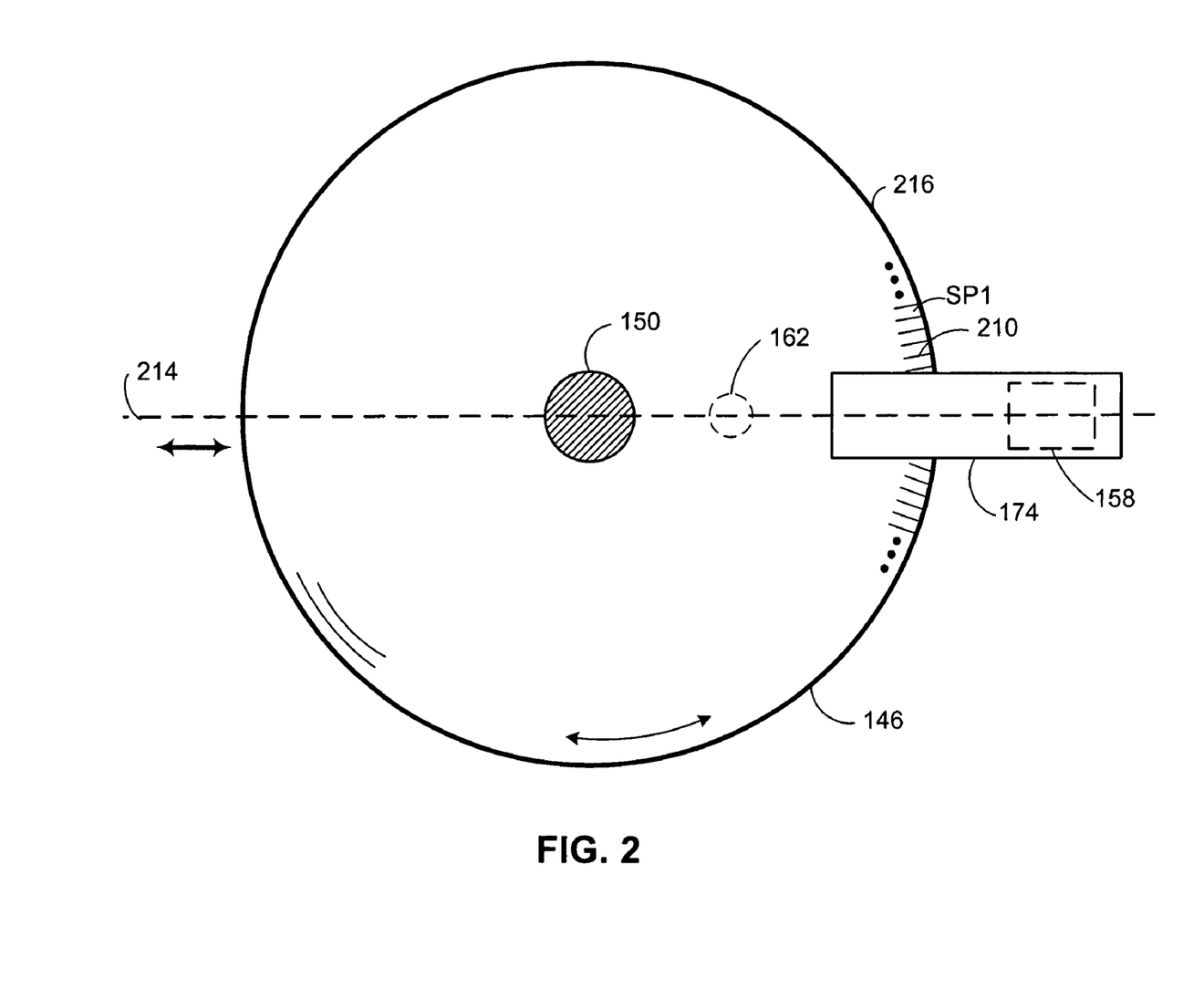
FIG. 2 is a high-level illustration of one embodiment of an encoder wheel of the electron beam substrate processing system of FIG. 1 in accordance with aspects of the invention.

FIG. 2 is a high-level illustration of one embodiment of an encoder wheel 146 of the electron beam substrate processing system 100 of FIG. 1 in accordance with aspects of the invention. Encoder wheel 146 includes a plurality of markings 210 (only some examples of which are illustrated in FIG. 2) generally disposed about an outer circumference of encoder wheel 146. To maximize the number of markings 210 relative the diameter of encoder wheel 146, markings 210 may be placed on an outer edge 216, i.e., outer circumference, of encoder wheel 146. Such markings 210 are detected by optical detector 174. For purposes of clarity, markings 210 shall be described in terms of an about equal spacing of SP1, however virtually any spacing configuration may be used to advantage. Spacing SP1 may be configured to suite a plurality of rotational speed control systems. For example, spacing SP1 may be configured to provide lower frequency rotation data signals 194 for those systems requiring lower frequency rotation data signal input. Thus, for such a case, markings 210 may be configured with spacing SP1 that is sized wider, e.g., markings 210 are further apart, to provide a lower number of markings 210 and therefore generate a lower frequency rotation data signal 194. In one aspect, to minimize angular aberrations during the electron beam writing process a center of optical encoder wheel 146 and optical detector 174 may be aligned along a longitudinal processing axis 214 parallel to the direction of movement of the substrate 160 relative electron beam 162 (See FIG. 1).

Figure 3:
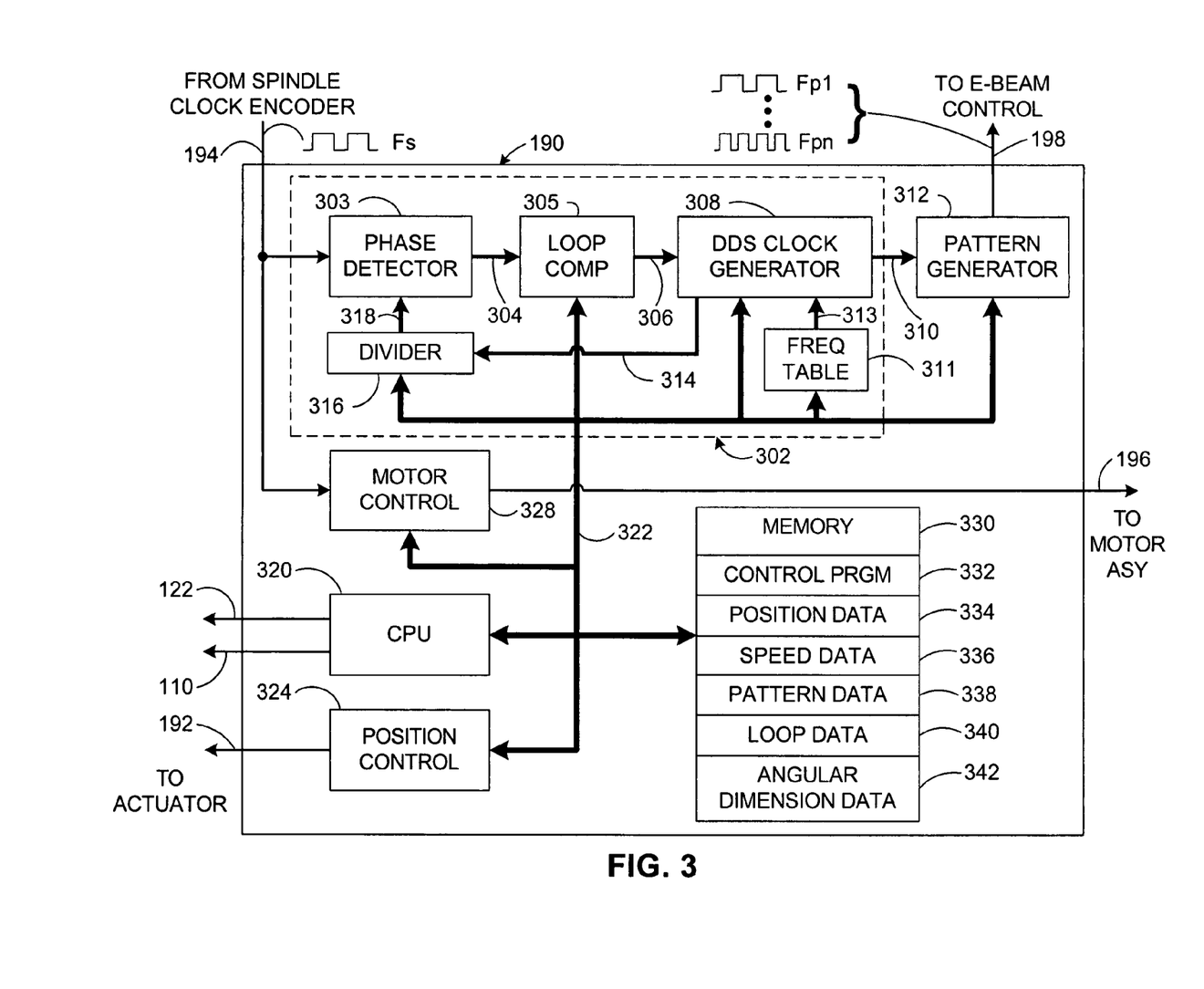
FIG. 3 is a high-level schematic of one embodiment of a substrate process controller of FIG. 1 in accordance with aspects of the invention.
Figure 4:
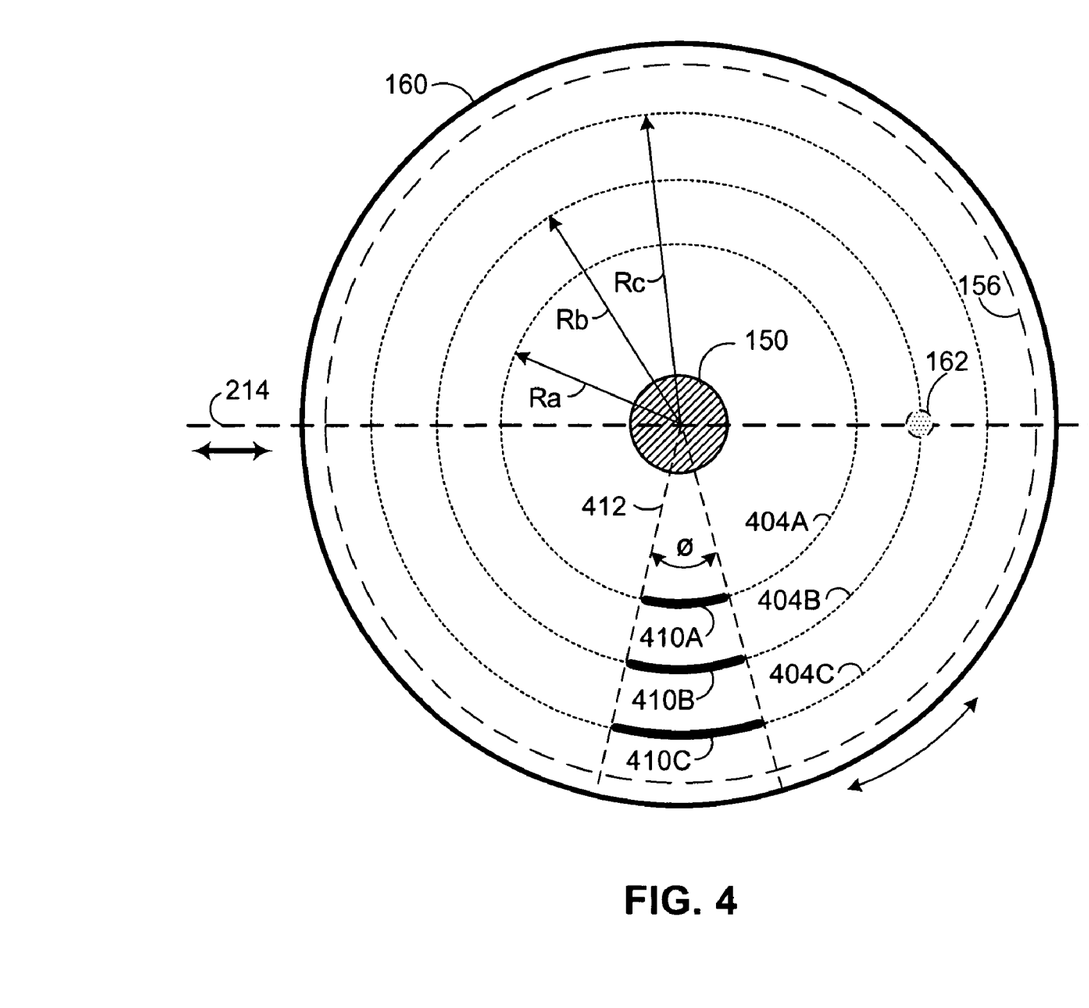
FIG. 4 is a high-level illustration of one embodiment of a substrate processed by the electron beam substrate processing system of FIG. 1 in accordance with aspects of the invention.

FIG. 3 is a high-level schematic of one embodiment of a substrate process controller 190 of FIG. 1 in accordance with aspects of the invention. FIG. 4 is a high-level illustration of one embodiment of a substrate 160 processed by the electron beam substrate processing system of FIG. 1 in accordance with aspects of the invention. In one aspect, with reference to FIG. 3, substrate process controller 190 includes Central Processing Unit (CPU) 320 and memory 330. CPU 320 may be under the control of an operating system that may be disposed in memory 330. Virtually any operating system supporting the configuration functions disclosed herein may be used. Memory 330 is preferably a random access memory sufficiently large to hold the necessary programming and data structures of the invention. While memory 330 is shown as a single entity, it should be understood that memory 330 may in fact comprise a plurality of modules, and that memory 330 may exist at multiple levels, from high speed registers and caches to lower speed but larger direct random access memory (DRAM) chips.

Illustratively, memory 330 may include substrate process control program 332 that, when executed on CPU 320, controls at least some operations of electron beam substrate processing system 100. The substrate process control program 332 may use any one of a number of different programming languages. For example, the program code can be written in PLC code (e.g., ladder logic), a higher-level language such as C, C++, Java, or a number of other languages. While substrate process control program 332 may be a standalone program, it is contemplated that substrate process control program 332 may be combined with other programs.

In one aspect, memory 330 may include speed data 336. Speed data 336 may be processed by substrate process controller 190 to control spindle motor assembly 134 to establish one or more rotational speeds of spindle shaft 150. Speed data 336 may include rotation velocity data derived from one or more sources such as a user, previous substrate processes, etc. In another aspect of the present invention, memory 330 may include position data 334. Position data 334 may be used by substrate process controller 190 to about horizontally position spindle motor assembly 134 within vacuum chamber 130. For example, position data 334 may be processed by CPU 320 to horizontally position spindle motor assembly 134 along longitudinal processing axis 214. Memory 330 may include pattern data 338 configured to provide one or more substrate processing data patterns. Pattern data 338 may be derived from one or more sources such as a user, process data, etc. For example, pattern data 338 may be determined by CPU 320 processing rotation data signal 194 and position data 334 with one or more algorithms to determine one or more angular positions of substrate surface targets based on rotational speed of substrate 160 and radial position e.g., processing radius, of electron beam 162 relative a center axis thereof. In one aspect of the present invention, memory 330 may include loop bandwidth data 340 and angular dimension data 342 described further below.

In one aspect, substrate process controller 190 includes motor control 328, pattern clock circuit 302, pattern generation circuit 312, and position control circuit 324. Motor control 328, pattern clock circuit 302, pattern generation circuit 312, and position control circuit 324 may be electrically connected to CPU 320 via bus 322. CPU 320 may be configured to control at least portion of motor control 328, pattern generation circuit 312, pattern clock circuit 302, and position control circuit 324 described herein. For example, CPU 320 may configure spindle motor assembly 134 to rotate spindle shaft 150 at one or more desired rotational speeds in response to speed data 336. Further, CPU 320 may be used to operate pattern generation circuit 312 such that at least some patterns stored in pattern data 338 are written on a surface of substrate 160. In addition, CPU 320 may be configured to position spindle motor assembly 134 to one or more radial processing positions, e.g., tracks, in proximity of electron beam 162 by controlling actuator 132 via signal 192 from position control circuit 324. To maintain a vacuum seal between vacuum chamber 130 and control section 178, signal 192 may be coupled to actuator 132 through seal 138.

Motor control 328 may be configured to control one or more rotational velocities of spindle shaft 150 using a feedback loop process. Such feedback loop process may include a variety of feedback techniques such as frequency lock, phase lock, and the like. Motor control 328 provides data signal 196 to spindle motor assembly 134 in response to rotation data signal 194 having frequency Fs. Motor control 328 may be configured to maintain loop control of a rotational velocity of spindle shaft 150 over a range of rotational speed velocities. For example, motor control 328 may be controlled by substrate process controller 190 to vary the rotational speed of spindle shaft 150 as a function of substrate radius, e.g., track position to maintain about a constant linear velocity (CLV), and may be controlled by substrate process controller 190 to maintain the rotational speed of spindle shaft 150 at about a constant angular velocity (CAV).

In one CLV configuration, when processing substrates 160 used to transfer patterns for CAV media such as magnetic disk drives, and the like, motor control 328 may be configured in one CLV mode to maintain spindle shaft 150 at about a constant linear velocity. In another CLV configuration, when processing optical media used in CLV modes such as CDs, DVDs, and the like, motor control 328 may be configured to adjust rotational speed of spindle shaft 150 to another CLV mode to maintain spindle shaft 150 at about another constant linear velocity. To maintain a CLV mode, motor control 328 may be configured to process rotation data signal 194 to maintain rotation speed of spindle shaft 150 within a range of desired spindle shaft rotational speeds such as may be found in speed data 336 at an associated radial processing position.

In one aspect of the present invention, pattern clock circuit 302 is configured to provide pattern clock signal to pattern generator circuit 312 in response to rotation data signal 194. Pattern clock circuit 302 includes phase detector 303, loop compensation circuit 305, direct digital synthesizer (DDS) 308, frequency table 311, and divider 316. Phase detector 303, loop compensation circuit 305, DDS 308, and divider 316 form a digital phase locked loop (DPLL) circuit configured to phase lock an output signal 314 of DDS 308 to rotation data signal 194. Phase detector 303 outputs loop error signal 304 in response to a phase comparison between an output signal 318 from divider 316 and rotation data signal 194. Loop compensation circuit 305 provides bandwidth control for pattern clock circuit 302. To maintain DPLL control over a plurality of substrate process configurations, loop compensation circuit 305 may be dynamically configured to provide a desired range of DPLL response bandwidths. CPU 320 may be configured to provide DPLL bandwidth control signals to loop compensation circuit 305 via bus 322 as needed. For example, such DPLL bandwidth control signals may be derived from one or more sources such as a user, process data, etc., and stored as loop bandwidth data 340 for retrieval therefrom by CPU 320.

Loop compensation circuit 305 may include digital filtering circuits, such as digital signal processing circuits, and the like, configured to digitally filter loop error signal 304. In one configuration, loop compensation circuit 305 processes loop error signal 304 to provide signal 306 to DDS 308. DDS 308 outputs signal 314 to divider 316 in response to signal 306. Divider 316 may be configured to divide output signal 314 configured at one or more multiples of a frequency Fs of rotation data signal 194. Divider 316 may be virtually any divider such as, flip-flop divider configuration, counter, divide-by-n, and the like, that may be used to advantage. In one aspect, signal 314 and pattern clock signal 310 have the same frequency wherein divider 316 is configured to divide such a frequency to provide signal 318 at frequency Fs to another input of phase detector 303. In one embodiment, to increase a pattern writing resolution of electron beam assembly 180, pattern clock signal 310 may be configured with a greater frequency relative rotation data signal 194 frequency Fs but still be phase locked thereto. For example, rotation data signal 194 frequency Fs may have a frequency of 1 kHz while pattern clock signal 310 frequency may be configured to 10 KHz and phase locked to rotation data signal 194.

In another aspect of the present invention, pattern clock circuit 302 is configured to provide pattern clock signal 310 that varies in frequency as a function of radial processing position, e.g., recording track position. For example, frequency table 311 may be configured to output a frequency setting to DDS 308 via signal 313 that is associated with a respective radial processing position. Frequency table 311 may obtain such frequency settings from CPU 320 and memory 330 via bus 322. Loop compensation circuit 305 may be configured to process loop error signal 304 in response to such a DDS 308 frequency setting. In operation, DDS 308 may be configured to output a frequency of pattern clock signal 310 and signal 314 in response to such frequency setting from frequency table 311 associated with a respective radial processing position. Such DDS 308 signal 314 and pattern clock signal 310 associated with such a radial processing position are phase locked to rotation data signal 194 as described herein. In one aspect, pattern clock circuit 302 may be configured to vary pattern clock signal 310 in frequency with respect to frequency table 311 such that patterns written on a surface of substrate 160 vary in about a constant angular dimension with respect to a respective radial processing position. In one aspect, loop compensation circuit 305 is configured to set a desired loop response of pattern clock circuit 302 to accommodate changes in DPLL response to one or more frequencies of pattern clock signal 310. For example, loop compensation circuit 305 may set DPLL loop bandwidth of pattern clock circuit 302 to accommodate a 2-to-1 change in a frequency of pattern clock signal 310.

In one operational mode of electron beam substrate processing system 100, for processing substrates 160 associated with CLV systems such as CDs and DVDs, substrate 160 is rotated at about a constant linear velocity. Pattern clock circuit 302 is configured to generate pattern clock signal 310 having a frequency of operation that is fixed to provide a data mark about fixed in dimension. Such a frequency clock signal 310 is then provided to pattern generator circuit 312 for processing thereof.

In another operational mode of electron beam substrate processing system 100, when processing substrates 160 associated with CAV systems, such as disk drives, substrate 160 is rotated at about a constant linear velocity. Pattern clock circuit 302 is configured to generate a pattern clock signal 310 having a variable frequency of operation that is lower in frequency at an outer radial position than at an inner radial processing position. Such a variable frequency of operation is configured to write data marks, i.e., patterns that vary in angular dimension with respect to a radial position. Such a frequency varying pattern clock signal 310 is then provided to pattern generator circuit 312 for processing thereof as described below.

Pattern generator circuit 312 controls at least some of the operations of electron beam assembly 180 to generate an electron-beam processing pattern. For example, pattern generator circuit 312 may process pattern clock signal 310 to determine processing times to activate or deactivate a blanking operation of electron beam assembly 180 based on one or more constant linear velocities of substrate 160 and a position of the electron beam 162 relative one or more target processing areas of substrate 160. In one aspect, pattern generator circuit 312 outputs control signal 198 responsive to pattern clock signal 310 that varies in frequency as a function of a radial processing position e.g., processing track position. For example, control signal 198 may be configured in response to pattern clock signal 310 to provide frequency Fp1 of control signal 198 at a first radial processing position, and a different frequency Fpn at another processing position. Frequency Fpn corresponds to an "n" number of radial processing positions. For example, control signal 198 may be configured to a frequency of Fp1 at a first track position, a frequency of Fp2 at a second track position, a frequency of Fp3 at a third track position, and so forth. Such control signal 198 may be used to modulate electron beam 162 on and off to process substrate 160 in accordance to such frequencies Fp and Fpn. In one configuration, pattern data 338 is provided to pattern generator circuit 312 via bus 322. Such pattern data 338 may be used with control signal 198 to write one or more patterns on at least some portion of the surface of substrate 160 exposed to electron beam 162, wherein at least some of the patterns written have at least one angular dimension that varies as a function of substrate radius.

In one operational embodiment, spindle shaft 150 rotates encoder 146 and substrate 160 at about a constant linear velocity. As described herein, optical detector 174 provides rotation data signal 194 associated with the rotation of encoder 146 to substrate process controller 190. Motor control 328 receives and processes rotation data signal 194 and outputs in response thereto signal 196 to spindle motor assembly 134. Signal 196 controls spindle motor assembly 134 to control one or more rotational speeds of spindle shaft 150 at about such a constant linear velocity. CPU 320 determines processing patterns associated with substrate rotation speeds and positional placement of each substrate target to position electron beam 162 thereon. Such processing patterns may be stored in memory 330 as pattern data 338 and may be sent to pattern generator circuit 312 for processing thereof via bus 322. Pattern clock circuit 302 generates pattern clock signal 310 in response to rotation data signal 194. CPU 320 controls pattern generator circuit 312 to process pattern clock signal 310. Pattern generator circuit 312 outputs control signal 198 to electron beam assembly 180 for control of electron beam 162 in response to pattern clock signal 310 and pattern data 338. Therefore, during processing as substrate 160 is rotated, rotation speed of substrate 160 is controlled using rotation data signal 194 and electron beam 162 is turned on and off in accordance to pattern data 338 clocked by pattern clock signal 310. Pattern generator circuit 312 outputs control signal 198 to electron beam assembly 180 for control of electron beam 162 in response to pattern clock signal 310.

In response to a version of pattern clock signal 310 that varies in frequency as a function of radial processing position, pattern generator circuit 312 provides processing patterns that vary in at least one angular dimension as a function of substrate radius in order to provide data marks that may be read in a constant angular velocity playback apparatus such as a disk drive. For example, referring now to FIG. 4, substrate 160 has at least one track 404A-C (three are shown). Track 404A has a radius Ra, track 404B has a radius Rb, and track 404C has a radius Rc with respect to the center of substrate 160. During processing, electron beam 162 is turned on and off in accordance to pattern data 338 clocked by pattern clock signal 310 to form data mark 410A, data mark 410B, and data mark 410C, each data mark 410A-C having an angular dimension that corresponds to angle $\phi$ defining wedge shaped data pattern region 412.

In summary, during processing in one CLV mode, as substrate 160 is rotated at about a constant linear velocity, rotation speed of the substrate 160 is controlled using rotation data signal 194 and electron beam 162 is turned on and off in accordance to pattern data 338 clocked by pattern clock signal 310. Such pattern clock signal 310 is configured at a frequency associated with radial processing positions to provide data patterns that occupy about a constant angular dimension with respect to the substrate radius, e.g., track position.

Figure 5:
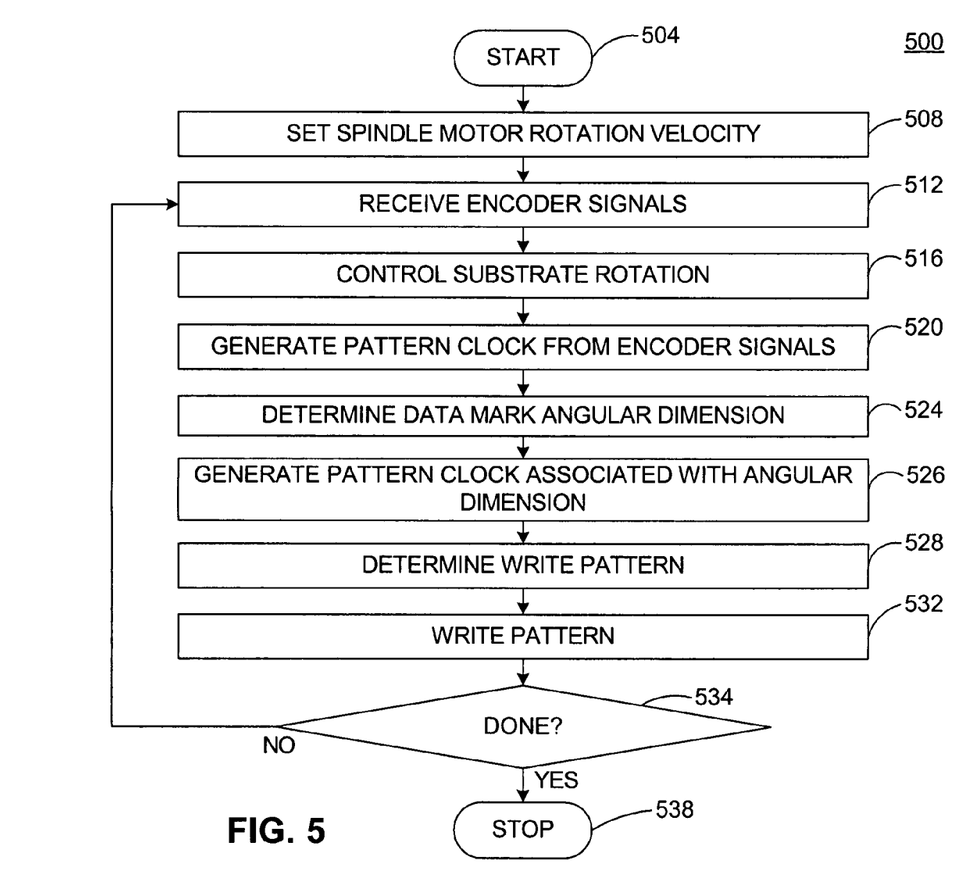
FIG. 5 is a high-level flow diagram of one embodiment of a method of processing a substrate with an electron beam processing system of FIG. 1 in accordance with aspects of the invention.

FIG. 5 is a high-level flow diagram of one embodiment of a method 500 of processing a substrate with an electron beam processing system 100 of FIG. 1 in accordance with aspects of the invention. Method 500 is entered in to at 504, for example, when substrate process control program 332 is activated. At 508, at least one constant linear velocity of shaft 150 of spindle motor assembly is established within a desired constant linear velocity error range relative a respective radial processing position of a substrate 160 being processed. At 512, at least some rotation data signals 194 associated with such a constant linear velocity are processed to determine a constant linear velocity of spindle shaft 150. At 516, rotational velocity of spindle shaft 150 is controlled within a desired range of such a constant linear velocity using at least some rotation data signals 194. Rotation data signals, e.g., rotation data signal 194 from encoder 146, are processed to generate pattern clock signals 310 at 520. At 524, at least some data pattern, e.g., data marks 410A-C, angular dimensions are determined. At least some of such angular dimensions of such data patterns are associated with a respective radial processing position on a substrate 160. In one aspect, at 524 at least some of such angular dimensions may retrieved from angular dimension data 342 (See FIG. 3). A pattern clock signal 310 having a variable frequency Fp-Fpn that is associated with a respective radial processing position and configured to provide data patterns that are about constant in such angular dimensions is generated at 526. At 528, a writing pattern of such data patterns for a substrate is determined. For example, such writing pattern may be derived from pattern data 338. At 532, such a writing pattern is written on a substrate surface in accordance to timing of such pattern clock signal 310. If at 532, method 500 is not finished method 500 proceeds to 512. However, if at 532, method 500 is finished, method 500 proceeds to 538 and ends.

While the foregoing is directed to embodiments of the invention, other and further embodiments of the invention may be devised without departing from the basic scope thereof. The scope of the invention is determined by the claims that follow and equivalents.

The invention claimed is:

1. An electron beam substrate processing apparatus, comprising:
   a substrate processing chamber defined by sidewalls, a bottom, and a top;
   a spindle motor assembly moveably disposed within the substrate processing chamber;
   a spindle shaft extending from the spindle motor assembly toward the top;
   a substrate support member mounted to an end of the spindle shaft distal the spindle motor assembly;
   an encoder wheel coupled to the spindle shaft and positioned adjacent the substrate support member;
   an optical detector positioned in optical communication with the encoder wheel, the optical detector being configured to generate rotation data signals in response to detected rotation of the encoder wheel;
   a pattern generator circuit configured to generate an electron beam control signal in response to the rotation data signals, wherein the electron beam control signal frequency varies as a function of at least one processing radius and angular velocity associated thereto; and
   an electron beam assembly responsive to the electron beam control signal, the electron beam assembly being disposed on the substrate processing chamber and configured to direct the electron beam onto a surface of the substrate for processing.

2. The apparatus of claim 1, further comprising an actuator coupled to the spindle motor assembly and configured to move the spindle motor assembly in a horizontal motion relative a longitudinal axis of the spindle shaft.

3. The apparatus of claim 1, further comprising a vacuum pump coupled to the substrate processing chamber to provide a vacuum therein.

4. The apparatus of claim 1, wherein the apparatus comprises a motor speed control circuit configured to process at least some of the rotation data signals to control a rotation velocity of the spindle shaft.

5. The apparatus of claim 1, wherein the apparatus comprises a signal processing circuit configured to provide clock data signals to the pattern generation circuit that vary as a function of the at least one processing radius in response to at least some of the rotation data signals received thereto.

6. A method of processing substrates with an electron beam processing system, comprising:
   rotating a substrate support member configured to hold the substrate thereon for processing;
   generating rotation data signals from one encoder assembly associated with a rotational movement of the substrate support member;
   generating pattern clock signals from the rotation data signals that vary in frequency as a function of at least one processing radius and an angular velocity associated thereto; and
   generating an electron beam processing pattern for writing a pattern on a surface of the substrate from at least some of the pattern clock signals, wherein the processing pattern varies in angular dimension as a function of the at least one processing radius.

7. The method of claim 6, wherein the generating rotation data signals comprises optically detecting the rotational movements of an encoder wheel in axial alignment with the rotating substrate support member.

8. The method of claim 6, further comprises processing at least some of the rotation data signals with a motor control circuit configured to maintain one or more desired rotational speeds of the substrate support member.

9. The method of claim 6, wherein the generating pattern clock signals comprises generating the frequency of the pattern clock signals proportional to a change of the at least one processing radius.

10. The method of claim 6, wherein the generating the electron beam processing pattern comprises generating an electron beam control signal having a frequency that varies as function of the at least one processing radius.

11. The method of claim 10, wherein the generating the electron beam control signal comprises processing the pattern clock signals having the frequency that varies as function of the at least one processing radius to generate the electron beam control signal.

12. The method of claim 11, wherein the processing the pattern clock signals comprises determining the at least one processing radius and determining a frequency of the pattern clock signal associated with the at least one processing radius.

13. An apparatus for processing a substrate with electron beams, comprising:
rotation means for rotating a substrate support member for processing the substrate thereon;
signal generator means for generating a rotation clock signal from the axial rotation of the substrate;
means for generating a pattern clock signal from the axial rotation of the substrate that varies in frequency as a function of radial processing position and angular velocity of the substrate associated thereto; and
an electron beam generation means for processing the substrate with electron beams associated with the pattern clock signal.

14. The apparatus of claim 13, further comprising processor means for processing the pattern clock signal to provide a substrate process pattern therefrom to the electron beam generation means that varies with the radial processing position.

15. The apparatus of claim 13, wherein the rotation means comprises a movable spindle motor assembly having a spindle shaft extending therefrom coupled on one end to the substrate support member.

16. The apparatus of claim 13, wherein the signal generator means comprises at least one encoder wheel positioned on the spindle shaft parallel to and adjacent a substrate support member configured to support the substrate thereon for processing.

17. The apparatus of claim 13, wherein the signal generator means comprises a means for detecting timing marks on the at least one encoder wheel to generate the rotation clock signals.

18. The apparatus of claim 13, wherein the means for generating the pattern clock signal comprises a pattern clock generation circuit.

19. The apparatus of claim 18, wherein the pattern clock generation circuit comprises a digital phase locked loop circuit configured to provide the pattern clock signal in response to the rotation clock signal.

20. The apparatus of claim 19, wherein the phase locked loop comprises a loop bandwidth control circuit configured to vary the loop bandwidth of the phase locked loop as a function of at least one of the frequencies of the pattern clock signal.

* * * * *